United States Patent
Crosland et al.

(10) Patent No.: US 7,053,388 B2
(45) Date of Patent: May 30, 2006

(54) DUAL-MODE ELECTRON BEAM LITHOGRAPHY MACHINE

(75) Inventors: Nigel Crosland, Linton (GB); Klaus-Dieter Adam, Jena (DE); Timothy Groves, Cambridge (GB); Jeffrey Kristoff, Hilton Head Island, SC (US); Brian Rafferty, Bury St. Edmunds (GB); Gerhard Schubert, Jena (DE)

(73) Assignee: Leica Microsystems Lithography Ltd., Cambridge (GB)

( * ) Notice: Subject to any disclaimer, the term of this patent is extended or adjusted under 35 U.S.C. 154(b) by 0 days.

(21) Appl. No.: 10/903,421

(22) Filed: Jul. 30, 2004

(65) Prior Publication Data

US 2005/0045836 A1 Mar. 3, 2005

(30) Foreign Application Priority Data

Aug. 1, 2003 (GB) .................................... 0318119

(51) Int. Cl.
*H01J 37/08* (2006.01)

(52) U.S. Cl. ........................ 250/492.23; 250/492.22; 250/396 R; 430/296

(58) Field of Classification Search ........... 250/492.23, 250/492.22, 396 R; 430/296
See application file for complete search history.

(56) References Cited

U.S. PATENT DOCUMENTS

| | | | |
|---|---|---|---|
| 6,288,406 B1 * | 9/2001 | Penberth et al. | 250/492.22 |
| 6,320,198 B1 * | 11/2001 | Ito et al. | 250/492.22 |
| 2004/0119021 A1 * | 6/2004 | Parker et al. | 250/396 R |

FOREIGN PATENT DOCUMENTS

| | | |
|---|---|---|
| GB | 2 328 073 | 2/1999 |
| JP | 11297254 A | 10/1999 |

\* cited by examiner

*Primary Examiner*—Nikita Wells
*Assistant Examiner*—Zia R. Hashmi
(74) *Attorney, Agent, or Firm*—Houston Eliseeva LLP

(57) ABSTRACT

A dual-mode electron beam lithography machine (10) comprises an electron beam column (11) for generating an electron beam (12) for writing a pattern on a surface of a substrate 14) by way of a writing current, the substrate being supported on a stage (13) movable to displace the substrate relative to the beam. The column (10) includes beam deflecting plates (16) for deflecting the beam to scan the substrate surface in accordance with the pattern to be written and beam blanking plates (15) for blanking the beam to interrupt writing. The machine further comprises control means (17 to 20) for changing each of writing current, stage movement, beam deflection and beam blanking between a predetermined first mode optimised for pattern-writing accuracy, thus resolution, and a predetermined second mode different from the first mode and optimised for pattern-writing speed, thus throughput.

16 Claims, 1 Drawing Sheet

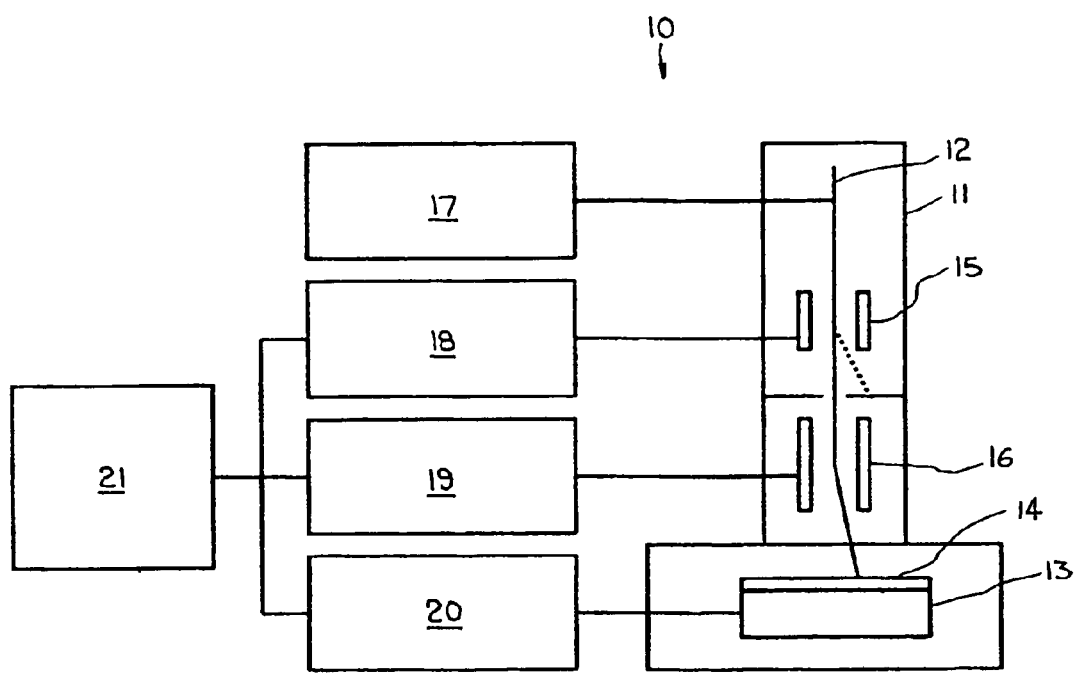
FIGURE

US 7,053,388 B2

DUAL-MODE ELECTRON BEAM LITHOGRAPHY MACHINE

RELATED APPLICATIONS

This application claims priority of the British patent application 03 18 119.5 which is incorporated by reference herein.

FIELD OF THE INVENTION

The present invention relates to a dual-mode electron beam lithography machine.

BACKGROUND OF THE INVENTION

Electron beam lithography machines are primarily used for, in particular, writing patterns, such as electrical circuits, on substrates. In such a process, a suitably prepared surface of a substrate supported on a movable stage is exposed to a focussed electron beam, in particular a writing spot or probe of the beam, which traces an intended pattern on the surface and generates the pattern by, for example, corresponding influence on a resist coating of the surface. The resolution of the beam is, for practical purposes, unlimited. The ultimate resolution limit of focussed electron beams is encountered in the realm of transmission electron microscopes, which operate at atomic dimensions of 0.1 nm. This is two to four orders of magnitude smaller than practical dimensions for lithography machines. However, with respect to throughput, electron beam lithography has been too slow for applications such as mainstream silicon VLSI manufacturing. There are two reasons for this:

i) Electron beam exposure is a serial process, in which a single beam scans the pattern area to expose pattern features in sequence. By contrast, in optical lithography an entire pattern can be exposed at the same time.

ii) The usable current in probe-forming electron beam systems is limited by Coulomb interaction in the beam path, whereby increase in the current causes the writing spot to blur and thus degrades resolution.

All electron beam lithography machines commonly in use exhibit these characteristics. The serial nature of the exposure process can be improved by exposing multiple pixels in parallel. A Gaussian beam system exposes merely one pixel at a time and thus is inherently serial. A variable shaped beam system exposes, for example, between 16 and 256 pixels simultaneously and, by virtue of the pixel parallelism, is necessarily faster than a Gaussian system. Similarly, cell projection and electron beam projection are faster than variable shaped beam systems, because they utilise a higher degree of pixel parallelism.

Throughput can be characterised as pattern-writing speed, which is defined as, for example, maximum area swept out per unit time by the writing probe. One possible method of increasing throughput is to increase the writing current. However, blurring of the writing spot, or loss of resolution, caused by the Coulomb interaction becomes more pronounced as the writing current is increased. In order to obtain acceptable clarity of the written pattern it is necessary for the lateral blurring of the spot to be a reasonably small fraction of the minimum size of the features of the pattern. Above a limiting value of the writing current the blurring becomes unacceptably pronounced for the size of pattern features desired. The smaller the pattern features, the less the limiting value of the writing current. This results in a compromise between resolution and throughput.

In order to take full advantage of pixel parallelism for a variable shaped beam it would be necessary to increase the writing current by a factor equal to the pixel parallelism. This is not practical, as the Coulomb interaction would unacceptably degrade resolution. All probe-forming electron beam systems are limited with respect to usable writing current by the Coulomb interaction, with systems utilising high pixel parallelism being somewhat faster.

In addition to the constraints on throughput discussed in the foregoing, another limitation arises from the requirement for every electron beam system to perform various functions during which no actual writing takes place. These functions include loading and pumping the substrate, moving the support stage to new locations, deflecting the beam to a new scanning position and calibrating the system. Actions of these kinds result in an overhead time which detracts from throughput. In many cases the overhead time represents a significant fraction of the total time needed to process a substrate. In these cases it would be desirable to reduce the overhead time to the minimum possible.

A significant overhead is represented by the time required for the stage to move to a new location in order to accomplish a large area exposure. Whereas many of the other overheads are electrical in origin, the stage motion is mechanical and results in an overhead which is inherently larger than an electrical overhead due to the inertia of the usual relatively substantial stage construction. In the case of a pattern with relatively few or widely spaced features, the overhead times associated with stage motion to locate the feature areas in a writing zone can form the most significant limitation on throughput.

In order to make full use of the high resolution capability of an electron beam it is necessary to ensure accurate placement of pattern features to within a small fraction of the minimum pattern feature size, i.e. to provide precise beam deflection to scan the pattern features. Beam deflection is usually controlled by a beam deflector powered by electronic amplifiers which provide a trade-off between noise and bandwidth. The lower the bandwidth, the less the noise. However, a high throughput requires a high bandwidth to achieve the desired speed to minimise the overhead time associated with the beam deflection. A high bandwidth results in a greater degree of noise, which degrades the placement accuracy of pattern features. This area, in particular the electronic noise connected with the beam deflection, represents another conflict between the requirements of resolution and throughput.

All of the factors mentioned in the foregoing lead to the situation that it is possible to obtain high resolution or high throughput, but not both at the same time. Known electronic beam systems of given construction are, by virtue of design and system configuration, useful for either high resolution or high throughput. High resolution usually requires a finely focused beam, high electronic precision and high mechanical stability. High throughput requires high writing current, high-speed electronics and minimal overhead times. Existing electron beam systems cannot be configured to achieve all these attributes and would require fundamental adaptation of basic components to change from high resolution to high throughput.

SUMMARY OF THE INVENTION

It is therefore the object of the present invention to provide an electron beam lithography machine which has the capability to operate, in dependence on operator wish, in a manner emphasising high resolution or in a manner emphasising high throughput. A subsidiary object of the invention is to provide an electron beam machine which, having regard to the substantial investment cost attaching to machines of that kind, can be converted between different operating configurations without obliging exchange or complicated adaptation of basic components.

According to the present invention there is provided a dual-mode electron beam lithography machine comprising an electron beam column for generating an electron beam for writing a pattern on a surface of a substrate by way of a writing current, a movable stage for supporting the substrate and displacing the substrate relative to the beam, beam deflecting means for deflecting the beam to scan the substrate surface in accordance with the pattern to be written, beam blanking means for blanking the beam to interrupt writing and control means for changing each of writing current, stage movement, beam deflection and beam blanking between a predetermined first mode optimised for pattern-writing accuracy and a predetermined second mode different from the first mode and optimised for pattern-writing speed.

An electron beam lithography machine embodying the present invention is capable of conversion between a high-resolution configuration, i.e. the mode optimised for pattern-writing accuracy, and a high-throughput configuration, i.e. the mode optimised for pattern-writing speed, without exchange or modification of the components of the machine that principally influence the levels of attainable writing accuracy and writing speed. Rather, the four specified variables are each controllable by the control means, for example by way of software of a machine control system, to enable writing with use of the same basic components in a selectable one of two modes each optimised for a respective task. In addition, it is recognised by the present invention that the four variables, namely writing current, stage movement, beam deflection and beam blanking, are highly interactive to the extent that disregard of any one of these parameters compromises the capability of the machine to achieve the desired degree of resolution or throughput.

Preferably, the control means is operable to vary the writing current between a lower value for the first mode and a higher value for the second mode. In general, low current is consistent with high resolution, but reduced throughput, and high current is consistent with high throughput, but degraded resolution. It is, however, desirable for the control means to be operable to determine the value of the writing current in each mode by reference to a parameter of at least one of stage movement, beam deflection and beam blanking, so that the writing current can be consistent with, for example, stage speed and blanking rate, and thus provide synchronism of the machine functions. Preferably, also, the control means is operable to determine the value of the writing current in each mode by reference to a given characteristic of the substrate, for example sensitivity of a resist coating of the substrate surface.

The writing current is readily adjustable by a variety of methods, for example, by varying—by way of the control means—current from an electron source of the column or current transmitted through at least one beam-deflecting aperture of the column. The writing current does not have to be maintained at fixed values in the modes and to enhance the adaptability of the column to the specific requirements of high resolution and/or high throughput the control means can be operable to vary the value of the current in at least one of the modes and within a range respective to that mode.

With respect to stage movement, the control means is preferably operable to change this movement between stepped movement for the first mode and substantially continuous movement for the second mode. In stepped movement, writing takes place after each relocation of the stage in a new position and when the stage is at rest, the movement of the stage between different positions usually being undertaken to locate different areas substrate, more specifically fields of the pattern, in a predetermined scanning zone of the beam writing spot. Since no writing occurs during the time required to move and settle the stage, this represents overhead time which detracts from throughput. On the other hand, certain factors potentially disruptive to attainment of high resolution, for example vibration associated with stage movement and dynamic beam tracking errors arising if writing is carried out while the stage is not at rest, are eliminated or, at least, significantly reduced. The conditions linked with stepped movement of the stage are thus conducive to high accuracy of pattern placement and consequently are consistent with high resolution operation. Conversely, in the case of continuous stage motion the writing takes place while the stage is moving. The writing therefore has to be synchronous with the instantaneous stage position in order to achieve accurate placement of the pattern features. This mode of operation minimises the overhead associated with movement of the stage to new positions, i.e. stepped stage motion, since pattern writing and stage movement are simultaneous. It therefore lends itself to high throughput. However, continuous stage movement has the disadvantage of diminished accuracy of pattern placement. This is attributable to two sources: firstly, continuous stage motion is inevitably accompanied by vibration, especially during those phases of motion in which there is change in direction of travel of the stage, and, secondly, a class of placement error arises from the need for the electron beam to constantly track the substrate carried by the continuously moving stage. For this purpose, the control means preferably comprises means to detect the instantaneous position of the stage during movement thereof in the second mode and to influence one of stage drive means and the beam deflecting means in dependence on the detected position. There is thus provided a feedback loop in which the instantaneous stage position is measured continuously and position information is fed back to the control of the beam deflection.

As in the case of the writing current, the versatility of the column may be able to be increased if the control means is operable to vary the rate of movement of the stage in at least one of the modes and within a range respective to that mode. In that case, the control means can be operable to vary the rate of movement of the stage in the first mode by, for example, varying the intervals between steps in the movement.

For preference, the control means is operable to change the beam deflection between vector deflection for the first mode and raster deflection for the second mode. Continuous stage motion tends to favour raster deflection, as the position errors associated with the deflection are more repeatable and can be corrected by means of measurement and calibration. Raster deflection suffers from the fact that the minimum grid increment is intimately dependent on the raster period and thus this form of deflection has inherently coarser grid increments, which tend to compromise pattern placement accuracy. Raster deflection is therefore inconsistent with high resolution. Alternatively, vector deflection is capable of finer grid increments, but is slower than raster deflection. The reason for the slow speed is that the errors tend to be dependent on deflection history and thus are not repeatable.

The only way in which repeatability can be achieved is to operate more slowly, which tends to compromise throughtput.

Preferably, the beam deflecting means is operable to deflect the beam in dependence on supply of data characterising the pattern and is controllable to maintain synchronisation of the beam deflection with the data supply in each of the two forms of beam deflection. Synchronisation can be achieved, for example, by a capability for appropriately structuring control software of the machine. The same circuitry can be used for both forms of beam deflection, with compensation provided for differing bandwidth requirements.

In addition, the control means may be operable to vary the rate of beam deflection in at least one of the modes and within a range respective to that mode.

The desired influence on beam blanking for optimisation with respect to resolution or with respect to throughput may be achieved if, for example, the control means is operable to change the rate of beam blanking between a lower value for the first mode and a higher value for the second mode. In general, a high blanking rate is desirable in conjunction with high writing current, high stage speed and a sensitive resist coating of the substrate. These attributes are consistent with high throughput, but tend to compromise high resolution and image fidelity. Preferably, the control means is operable to vary the rate of beam blanking in at least one of the modes and within a range respective to that mode. More specifically, the beam blanking rate can be tunable by, for example, adjustment of an electronic control system of the machine up to a maximum rate depending on the system design. In order to accommodate both writing modes it is desirable for the maximum rate to be as high as possible, for example 300 MHz or even higher. This permits all reasonable combinations of, inter alia, writing current and substrate resist sensitivity.

BRIEF DESCRIPTION OF THE DRAWINGS

A preferred embodiment of the present invention will now be more particularly described by way of example with reference to the accompanying drawing, the single FIGURE of which is a schematic elevation of a dual-mode electron beam lithography machine embodying the invention.

DETAILED DESCRIPTION OF THE INVENTION

Referring now to the drawing there is shown, in highly schematic form, an electron beam lithography machine 10 comprising an electron beam column 11 incorporating, at the top, beam generating means for generating an electron beam 12. The beam is oriented towards a stage 13 which is disposed in a vacuum chamber below the column and which is movable in X and Y directions. A substrate 14, for example a semiconductor wafer or a wafer mask, having an electron-sensitive resist coating on a surface thereof presented to the beam is removably mounted on the stage 13 in a fixed location by positioning and clamping means (not shown).

The column 11 contains, apart from the beam generating means, focussing means (not shown) for focussing the beam to produce a writing spot, which is characterised by a settable writing current, at the plane of the substrate resist coating, beam blanking plates 15 operable to blank the beam 12, i.e. to turn the beam on and off, and beam deflection plates 16 operable to deflect the beam 12, more specifically to displace the writing spot over the substrate resist coating to trace the features of a pattern thereon. Such a pattern can be, for example, an electrical circuit of integrated format.

The deflection of the beam 12 to scan the substrate is supplemented by displacement of the stage 13 in X and Y directions to position discrete areas of the substrate in a writing zone represented by a predetermined range of deflection of the beam or travel of the writing spot, such a range generally being less than the dimensions of the pattern in the corresponding X and Y directions.

Control of the various beam influencing systems of the machine is managed by a control system comprising a beam current electronic control block 17 for setting the value of the writing current, a beam blanking electronic control block 18 for controlling the rate of blanking of the beam 12 by the blanking plates 15, a beam deflection electronic control block 19 for controlling the beam deflection by way of the deflection plates 16 to carry out scanning of the substrate and a stage movement electronic control block 20 for controlling drive means (not shown) of the stage 13 produce movement of the stage relative to the beam.

The control system further includes a pattern generation block 21 for generating operating signals indicative of a given pattern to be written on the substrate and for causing the individual control blocks 18 to 20 to synchronously control the beam blanking, beam deflection and stage movement to write the pattern by way of the beam writing spot. The control block 17 influencing writing current can be similarly controlled by the pattern generation block 21 or, however, controlled separately. By contrast to the dynamic changes for which the blocks 18 to 20 are responsible, setting of the writing current by way of the block 17 represents a static adjustment.

The control blocks 17 to 20 are each capable of causing the respectively associated one of the four stated functions to be performed in a selectable one of two modes depending on the respective requirements. A first one of the modes is employed in the case of pattern-writing on substrates where accuracy in execution of the pattern features—thus resolution—is paramount and speed of writing is of secondary importance. The second one of the modes is employed where writing speed—thus throughput in execution of the pattern on successive substrates—is the primary concern. To achieve these modes the control block 17 is operable to set the writing current to a low value for the first mode and a high value for the second mode and the control block 18 is operable to cause beam blanking by way of the blanking plates 15 to be performed at a low rate for the first mode and a high rate for the second mode. Similarly, the control block 19 is operable to influence the deflection plates 16 to provide vector deflection for the first mode and raster deflection for the second mode and the control block 19 is operable to cause the stage drive means to move the stage in a step-and-repeat manner for the first mode and continuously for the second mode. The advantages attaching to the different levels of writing current, rates of beam blanking, forms of beam deflection and forms of stage motion have been explained in the introductory part of the description. Operation in each of the two modes can be achieved by way of software of appropriate configuration in the control system formed by the control blocks 17 to 20.

Consequently, depending on selection of the first mode or the second mode for the beam parameters and stage substrate motion, the machine 10 can be optimised for resolution or throughput without the need for change of basic components or for any other fundamental adaptation of the machine.

What is claimed is:

1. A dual-mode electron beam lithography machine comprising
    an electron beam column for generating an electron beam for writing a pattern on a surface of a substrate by way of a writing current;
    a movable stage for supporting the substrate and displacing the substrate relative to the beam;
    a control system for controlling the writing current comprising a plurality of blocks, the blocks being a beam blanking block, a beam current block, a beam deflection block and a stage movement block, the control system serving to switch between a Gaussian mode and a variable shined beam mode of operation of the lithography machine depending on the parameters of the blocks of the control system; and
    beam deflecting means for scanning the substrate surface in accordance with the pattern.

2. The lithography machine as claimed in claim 1, wherein the control system is operable to vary the writing current between a lower value for the Gaussian mode and a higher value for the variable shaped beam mode.

3. The lithography machine as claimed in claim 1, wherein the control system is operable to determine a value of a writing current in each mode by reference to a parameter of at least one of the stage movement block, beam deflection block and beam blanking block.

4. The lithography machine as claimed in claim 1, wherein the control system is operable to determine the value of the writing current in each mode by reference to a given characteristic of the substrate.

5. The lithography machine as claimed in claim 1, wherein the control system is operable to vary the writing current by varying a current from an electron source of the electron beam column.

6. The lithography machine as claimed in claim 1, wherein the control system is operable to vary the writing current by varying a current transmitted through at least one beam-deflecting aperture of the electron beam column.

7. The lithography machine as claimed in claim 1, wherein the control system is operable to vary the value of a current in at least one of the modes and within a range characteristic to at least one of the modes.

8. The lithography machine as claimed in claim 1, wherein the control system is operable to switch a stage movement between a stepped movement for the Gaussian mode and a substantially continuous movement for the variable shaped beam mode.

9. The lithography machine as claimed in claim 8, wherein the control system comprises means for detecting an instantaneous position of the stage during movement thereof in the variable shaped beam mode and for influencing one of stage drive means and the beam deflecting means depending on the detected instantaneous position.

10. The lithography machine as claimed in claim 8, wherein the control system is operable to vary a rate of movement of the stage in at least one of the modes and within a range characteristic to at least one of the modes.

11. The lithography machine as claimed in claim 10, wherein the control system is operable to vary the rate of movement of the stage in the Gaussian mode by varying the intervals between steps in the stepped movement.

12. The lithography machine as claimed in claim 1, wherein the control system is operable to change the beam deflection between a vector deflection mode for the Gaussian mode and a raster deflection mode for the variable shaped beam mode.

13. The lithography machine as claimed in claim 12, wherein the beam deflecting system is operable to deflect the beam depending on supply of data characterising the pattern and is controllable to maintain synchronisation of the beam deflection with the data supply in each of the two modes of beam deflection.

14. The lithography machine as claimed in claim 1, wherein the control system is operable to vary the rate of beam deflection in at least one of the modes and within a range characteristic to at least one of the modes.

15. The lithography machine as claimed in claim 1, wherein the control system is operable to change the rate of beam blanking between a lower value for the Gaussian mode and a higher value for the variable shaped beam mode.

16. The machine as claimed in claim 1, wherein the control system is operable to vary the rate of beam blanking in at least one of the modes and within a range characteristic to at least one of the modes.

* * * * *